United States Patent [19]

Smith

[11] 4,229,669
[45] Oct. 21, 1980

[54] TIGHT TOLERANCE ZERO CROSSING DETECTOR CIRCUIT

[75] Inventor: Gerald L. Smith, Broomfield, Colo.

[73] Assignee: International Business Machines Corporation, Armonk, N.Y.

[21] Appl. No.: 892,706

[22] Filed: Apr. 3, 1978

[51] Int. Cl.² ............................................ H03K 5/153
[52] U.S. Cl. .............................. 307/354; 307/252 UA; 307/311
[58] Field of Search ................ 307/252 UA, 311, 354; 323/18, 21, 24, 34

[56] References Cited

U.S. PATENT DOCUMENTS

| | | | |
|---|---|---|---|
| 3,693,027 | 9/1972 | Garaway | 323/21 |
| 3,862,439 | 1/1975 | Coccio | 307/252 UA |
| 4,051,394 | 9/1977 | Tieden | 307/354 X |

Primary Examiner—John Zazworsky
Attorney, Agent, or Firm—Pollock, Vande Sande & Priddy

[57] ABSTRACT

A zero crossing detector provides an optically coupled output signal with a leading edge which occurs in the vicinity of the zero crossing point of an AC voltage waveform but no later than the zero crossing time. The circuit input includes a filter and rectifier. The filtered and rectified voltage is then applied to a complex impedance circuit with an input and an output, which provides an output lagging its input. A switching device, which may be a light emitting diode, is coupled between the output of the impedance circuit and the rectifier. Thus, when the lagging output voltage of the impedance circuit exceeds the output of the rectifier, the switching device conducts, producing the output signal.

15 Claims, 3 Drawing Figures

4,229,669

TIGHT TOLERANCE ZERO CROSSING DETECTOR CIRCUIT

FIELD OF THE INVENTION

The present invention relates to zero crossing circuits and more particularly, to circuits for producing a signal in the vicinity of the zero crossing point of an AC voltage waveform.

BACKGROUND OF THE INVENTION

The art of controlling an electrical load has long recognized the advantage in switching loads at or near the zero crossing point of the power supply waveform. In response to this knowledge, many circuits have been designed for producing a control signal to achieve that end. More recently, the use of optical isolation has resulted in the design of zero crossing circuits which produce an optically coupled output signal in the vicinity of the zero crossing point.

In many of these applications, the accuracy with which the control signal matches the actual zero crossing point of the voltage supply waveform is not critical. For this reason, many circuits merely drop the input waveform, or a replica thereof, across a switching means such as a diode, and employ the diode's conduction as the output signal. Due to the forward voltage drop of the diode, and the diode photodetector gain, the relationship between the actual zero crossing point and the signal produced by the prior art zero crossing circuits are a function of the diode's characteristics, and since, typically, these devices are manufactured to relatively loose tolerances, so, too, is the tolerance between the output signal and the actual zero crossing point.

It is also very desirable to apply some filtering to the input line voltage signal to reduce the effect of line noise. In previous circuits, the amount of filtering that could be used was limited because the filter circuit introduces a signal time delay that makes the circuit tolerance problem worse.

Notwithstanding the fact that the circuits are useful in many applications, there are applications in which such loose tolerances are not acceptable. For example, in an application where the current through an incandescent lamp is to be phase controlled (by a triac, for example) and where the lamp current must be gradually increased from zero to the desired level, it is essential that the zero crossing circuit deliver an output signal which is no later than the actual zero crossing point of the supply voltage. Were the signal to be retarded slightly after the actual zero crossing point of the supply voltage, the signal which enables the triac would result in the lamp being illuminated for a full half cycle directly negating the desire to gradually bring the lamp current up to the desired level.

It is therefore an object of the invention to provide a zero crossing circuit in which an output signal is produced in the vicinity of the zero crossing point of a supply voltage waveform, but which is no later than the zero crossing point. It is another object of the invention to provide such a circuit which includes an optical isolator and in which the output signal timing is not a function of the isolator characteristics. It is still another object of the present invention to provide a zero crossing circuit providing an optically coupled output which is capable of compensating for the delays introduced into the voltage waveform by conventional filtering. It is yet another object of the invention to provide a zero crossing circuit which produces an output signal in the vicinity of zero crossing point of a supply voltage waveform, but no later than that point, which automatically compensates for the changes in line voltage. It is still another object of the present invention to provide a zero crossing circuit of the foregoing type which includes an impedance means including a capacitor, and in which the timing of the output signal is not sensitive to capacitor tolerances.

SUMMARY OF THE INVENTION

The present invention meets these and other objects of the invention by providing a zero crossing circuit for producing a signal in the vicinity of, but no later than, zero crossing point of an AC supply voltage waveform which includes a rectifying means for rectifying the supply voltage, impedance means with an input and an output coupled across the rectifying means and providing an output voltage lagging the rectifier output voltage and switching means for producing the desired signal coupled across the impedance means output and the rectifier so that when the impedance means output voltage exceeds the rectifier output voltage, the switching means is enabled. In a preferred form of the invention, the produced signal is optically coupled and therefore, the switching means comprises a light emitting diode. Furthermore, for noise immunity purposes, the rectifier has, at its input, a line voltage filter. The delay introduced into the zero crossing circuit waveform, as compared with the line voltage waveform, can be compensated for by the inventive zero crossing circuit. In such a preferred embodiment of the invention, the impedance means includes an RC circuit to produce the referred-to lagging output voltage. On the falling portion of the circuit waveform, the capacitor has charged above the output of the rectifier to enable the light emitting diode. Since the voltage which enables the light emitting diode is the difference between the voltage to which the capacitor is charged and the output of the rectifier, and this voltage difference grows rather rapidly, the actual characteristics of a light emitting diode, i.e., its forward voltage drop, plays little, if any, part in determining the time of production of the output signal. In addition, since the threshold at which the output signal is produced is determined, in part, by the line voltage, changes in line voltage are automatically compensated for. Finally, the LED is enabled to carry current only in the vicinity of the switching action, and thus, during the major portion of the supply voltage waveform, the LED is back biased and accordingly, the circuit draws substantially less current than do prior art circuits.

BRIEF DESCRIPTION OF THE DRAWINGS

Further characteristics and advantages of the invention will be disclosed in connection with the remaining portion of the specification when taken in conjunction with the attached drawings in which like reference numerals identify identical apparatus and in which.

DETAILED DESCRIPTION OF PREFERRED EMBODIMENTS

Figure 1:
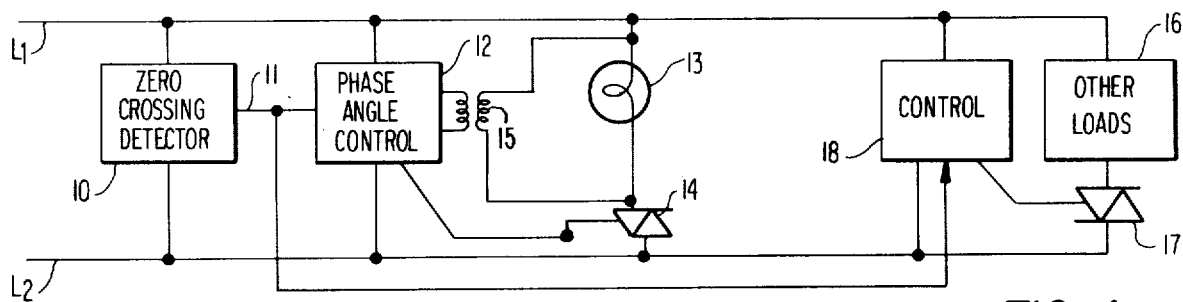
FIG. 1 is a schematic of a typical application of the invention.

FIG. 1 shows a typical application for the zero crossing detector of the invention. As shown there, an AC line voltage is applied by L1 and L2, which may comprise two conductors in a single phase AC supply or two phases of a multi-phase AC supply. Coupled across the line voltage is the inventive zero crossing detector 10. The zero crossing detector 10 provides an output on a line 11 which is coupled to control a phase angle control 12. Also coupled across the lines L1 and L2 is a series combination of an incandescent lamp 13 and a triac 14. The voltage produced across the lamp is also provided as an input to the phase angle control 12 by means of transformer 15 which provides an output to the gate control of the triac 14. Other loads, schematically represented at 16, are supplied by the line voltage and coupled in a series circuit with a further triac 17 whose gate control is provided by a control 18. A further input to the control 18 is derived from the output of the zero crossing detector.

The application of the zero crossing detector to control a current switch for a load, such as the load 16, is conventional in the art, and turn on of these loads in the vicinity of a zero crossing point is desirable to minimize transients. The phase angle control for the incandescent lamp 13 allows the current through the lamp 13 to be gradually increased so that the lamp is not damaged by a sudden inrush of current. It is the use of the zero crossing detector with such phase angle control which is the main impetus of the present invention. In order to gradually increase the current to the lamp 13, it is desired to initially enable a triac 14 just prior to the zero crossing point and then gradually walk back the turn on point so as to gradually increase the current through the lamp 13. However, because of the inherent characteristics of the triac 14, namely, once it is enabled, it remains enabled until the supply voltage decreases to the point where current is no longer conducted, small errors in the signal turning on the triac 14 can produce disastrous results. For example, if the triac 14 is enabled just after the zero crossing point, rather than just before it, what would have been a small phase angle, resulting in minimal initial current, becomes a large phase angle which results in the lamp 13 carrying current for a major portion of the cycle. This can and usually will result in destruction or degradation of the lamp, and therefore is to be avoided. Thus, while reasonable tolerances can be accepted between the output of the zero crossing detector 10 and zero crossing point, the zero crossing detector 10 must provide the output signal before the zero crossing point in order to protect loads such as the incandescent lamp 13.

Figure 2:
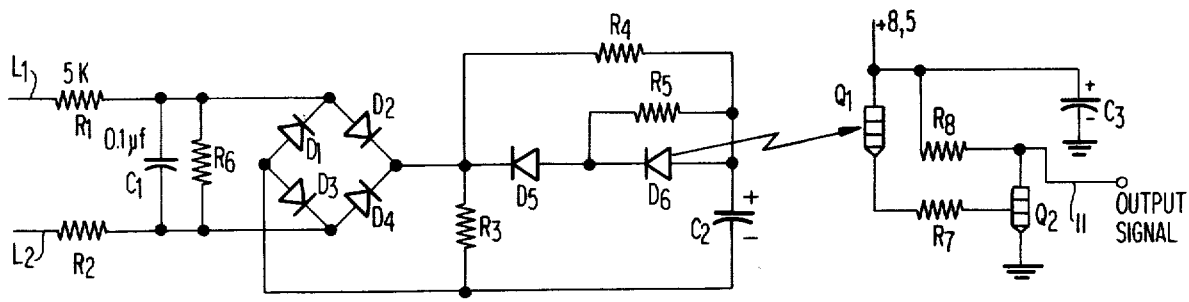
FIG. 2 is a schematic of the inventive circuit.

FIG. 2 is a schematic of one embodiment of the zero crossing detector 10 of the present invention. As shown, the line voltage from conductors L1 and L2 are supplied across a filter comprising resistors R1 and R2, a capacitor C1 and a resistor R6. The output of the filter is applied as an input to a full wave rectifying bridge comprising diodes D1 to D4. The bridge output, available between cathodes of diodes D2 and D4 and the anodes of the diodes D1 and D3, is coupled across a resistor R3. One terminal of the resistor R3 is coupled through a resistor R4 to a capacitor C2, whose other terminal is coupled to the other terminal of the resistor R3. Coupled in parallel with the resistor R4 is a series circuit comprising a diode D5 and a photodiode D6.

Coupled in parallel with the photodiode D6 is a leakage resistor R5. The photodiode D6 is optically coupled to a phototransistor Q1 which has its collector coupled to a positive source of potential and its emitter coupled through a resistor R7 to the base of the transistor Q2, whose emitter is grounded. The collector of the transistor Q2, which is the output transistor, is coupled to a supply potential through a resistor R8.

Although FIG. 2 illustrates the parameters of certain of the circuit components, those skilled in the art will be able, after reviewing the remaining portions of the specification, to vary these parameters depending upon line voltage and frequency. With the values shown, the circuit is adapted for use with the nominal 110 volt 60 cycle supply by shorting out resistor R2 and opening resistor R6. On the other hand, the same circuit can be employed with a 220 volt 50 cycle supply when R2 is 8.2 K and R6 is 18 K.

Figure 3:
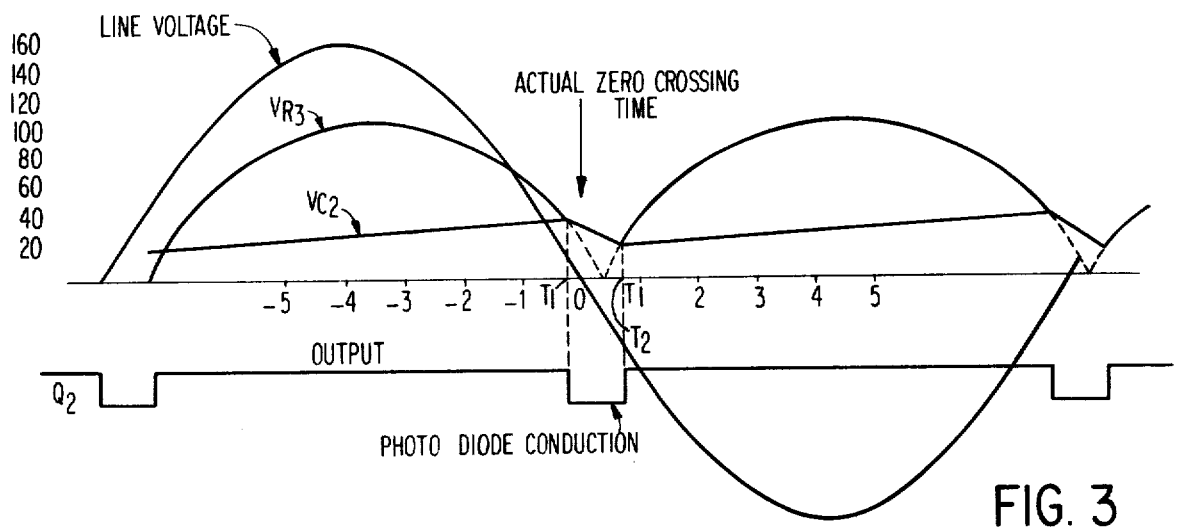
FIG. 3 is a timing diagram showing the relationships between various waveforms at different points in the circuit during typical operation.

Before describing typical operation, reference is briefly made to FIG. 3 which illustrates voltage waveforms at various points in the circuit during typical operation.

The line voltage waveform shown in FIG. 3 represents the voltage available at the conductors L1, L2 and passes through zero amplitude at the time labelled zero on the horizontal axis. The filtering action of R1, R2, R6 and C1 delays the waveform slightly and thus the voltage available at the resistor R3 is a delayed full wave rectified replica of the line voltage waveform and referenced Vr3 in FIG. 3.

In operation, the line voltage waveform is applied to L1 L2 and, the output of the rectifier increases, capacitor C2 charges through a resistor R4. The voltage at the capacitor is referenced VC2 in FIG. 3. During the portion of the cycle in which the capacitor is charging, the diodes D6 and D5 are back biased, since the voltage at the anode of D6 is less than the voltage at the output of the rectifier. Accordingly, diode D6 does not conduct. The diode D5 provides for voltage protection of the diode D6 and the resistor R5 is provided as a path for leakage current of diode D5.

As the line voltage reaches a peak and begins decreasing, so, too, does the output of the rectifier, although because of the delay introduced by the filter, the rectifier output peaks slightly later than the line voltage output.

At time T1 which is slightly before the actual zero crossing point of the line voltage, the capacitor voltage exceeds the rectifier output. At this time, the diodes conduct and the photodiode emits radiation in the form of light. When this occurs, the phototransistor Q1 is rendered conductive, which in turn, renders Q2 conductive, producing a transition in the voltage at the output line 11. During this time, rectifier diodes D1–D4 are back biased and therefore not conducting. The diodes D5 and D6 remain conductive, as the line voltage passes through zero and increases in the negative sense until the rectifier output again exceeds the capacitor voltage, at the time T2. At this time, the photodiode ceases to emit radiation, the phototransistor Q1 is turned off causing a further transition in the output voltage at Q2. Typically, control is based on the initial output transition (at T1) and the second transition in the output of Q2 has little or no role to play.

By selecting the capacitor time constant, that is, the resistance of R4 and the capacitance of C2, the slope of the voltage VC2 can be varied such that the time T1 leads the zero crossing point by the desired amount.

More significant than the exact amount of time that the conduction of D6 leads the zero crossing point is the fact that the time at which D6 begins to conduct is relatively insensitive to diode characteristics. Diode conduction is caused by a difference in potential between the voltage on capacitor C2 and the output of the rectifier. Both the quantities making up the potential difference are, at or near the conduction point, relatively large numbers and the difference is also rapidly changing so that variations in the forward voltage drop of the diode D6 and forward gain of the diode photodetector pair have little effect on the transition time T1.

Furthermore, to insure rapid switching of the diode D6, it is preferable to establish the discharge time constant, R3C2, such that C2 discharges at a rate equal to about one half the rate of change of VR3. With the parameters shown in FIG. 2 and 3, the difference between these two rates is about 15 volts per msec. With this rate, variation in the diode forward drop of 0.5 volts changes T1 by only about 33$\mu$ sec.

Another significant advantage of the circuit is that changes in line voltage have little or no effect on the timing of the output signal at conductor 11. More particularly, as the line voltage increases, for example, capacitor C2 also charges more rapidly and therefore to a higher potential. This has the effect of raising the threshold voltage of conduction to compensate for increases in line voltage. Indeed, 10% changes in line voltage result in almost immeasurable changes in the position of T1 with regard to the actual zero crossing point. Since it is the same capacitor C2 which charges through resistor R2 and discharges through resistor R3, the threshold voltage, i.e., the voltage at which diode D6 conducts is more a function of the ratio R4 to R3 than it is a function of the magnitude of C2. Accordingly, there are rather wide tolerances for the magnitude of C2.

It is another advantage of the invention that the diode D6 only conducts at about zero crossing time and thus the power consumed in the circuit is relatively small.

Those skilled in the art will be able to modify the embodiment disclosed herein within the scope of the invention. For example, the diode D5 and resistor R5 were added merely for purposes of protecting the photodiode D6. These components could be eliminated entirely if the photodiode could withstand about 100 volt reverse bias instead of the 3 volt reverse bias of the presently available components.

What is claimed is:

1. A zero crossing circuit for producing a signal with a transition in the vicinity of, but no later than, the zero crossing point of an AC voltage comprising:
   rectifying means with an input and an output coupled to said AC voltage providing at said output a rectified replica of a voltage applied at said input,
   impedance means with an input coupled to the output of said rectifying means, and an output, said impedance means providing at said output a voltage lagging a voltage applied to said impedance means input, and
   switching means comprising a diode coupled across said output and input of said impedance means for producing said signal as said diode is biased into conduction prior to a minimum in the output of said rectifying means by a difference in potential between said impedance means output and input said switching means producing a signal when and so long as said impedance means output exceeds said impedance means input.

2. The apparatus of claim 1 in which said signal is photo coupled and in which said diode in said switching means comprises a radiation emitting solid state device responsive to a difference in said impedance means output and input; a radiation sensitive solid state device responsive to said radiation emitting solid state device, coupled across a power supply and switched from a non-conducting to a conducting state when said radiation emitting solid state device emits radiation.

3. The apparatus of claim 1 in which said impedance means comprises in series a first resistor and a capacitor coupled across said rectifying means output and a discharge circuit for said capacitor also coupled across said rectifying means output.

4. The apparatus of claim 3 in which said switching means comprises a radiation emitting solid state device.

5. The apparatus of claim 4 wherein said switching means further includes a rectifier coupled in series with said radiation emitting device and a leakage current resistor coupled across said radiation emitting device.

6. The apparatus of claim 4 in which said radiation emitting device is an LED.

7. The apparatus of claim 1 which further includes line voltage filter means coupled between said rectifying means input and a source of said AC voltage.

8. The apparatus of claim 3 in which said first resistor has greater resistance than said discharge circuit.

9. A zero crossing detector to provide a signal in the vicinity of, but no later than, the zero crossing point of an AC voltage waveform comprising:
   a full wave rectifier with an input and output,
   a series RC circuit coupled to the output of said rectifier with a resistance R$_4$ and a capacitor with capacitance C,
   a partial discharge circuit for said capacitor C with resistance R$_3$ also connected to the output of said rectifier and,
   switching means for producing said signal coupled between said capacitor and said partial discharge circuit, said switching means producing a detectable output when a voltage on said capacitor exceeds an output voltage from said rectifier, which further includes:
   an optical coupling for said signal and wherein said switching means comprises a radiation emitting diode and a radiation sensitive active device for producing a voltage excursion on the sensing of radiation emitted by said radiation emitting diode.

10. The apparatus of claim 9 which further includes a line voltage filter coupled between a source of said AC voltage and said full wave rectifier.

11. The apparatus of claim 10 in which a product of said resistance R$_4$ and capacitance C is greater than the period of said AC voltage waveform.

12. The apparatus of claim 10 in which a product of said resistance R$_3$ and said capacitance C is less than the period of said AC voltage waveform.

13. A zero crossing detector for producing a signal timed in relation to a zero crossing of an AC voltage comprising:
   a full wave rectifier with input and output,
   a line filter coupled between said AC voltage and said full wave rectifier input,
   complex impedance means, with an input coupled to said full wave rectifier output and an output for producing an output voltage lagging a voltage coupled at said input of said complex impedance means, said complex impedance means including a capacitor across which said lagging voltage is produced and a charging circuit coupled thereto for charging said capacitor, and switching means comprising a diode coupled across said output and input of said complex impedance means for producing said signal as said diode is biased into conduction prior to a minimum in the output of said full wave rectifier by a difference of potential between output and input of said complex impedance means, whereby time delays occasioned by said line filter are prevented from influencing timing of said signal by selection of parameters of said charging circuit.

14. The apparatus of claim 13 wherein said diode comprises a radiation emitting solid state device, and wherein said switching means further includes a radiation sensitive solid state device responsive to radiation emitted by said radiation emitting solid state device and coupled across a power supply and switched from a non-conducting to a conducting state when said radiation emitting solid state device emits radiation.

15. The apparatus of claim 13 in which said complex impedance means comprises, in series, a first resistor and said capacitor coupled across said output of said rectifying means, and a discharge circuit for said capacitor including a second resistor also coupled across said output of said rectifying means.

* * * * *